United States Patent [19]
Morris

[11] Patent Number: 5,308,658
[45] Date of Patent: May 3, 1994

[54] PROCESS AND APPARATUS FOR EFFICIENT SPRAY COATING

[75] Inventor: Gilbert V. Morris, Amherst, N.H.

[73] Assignee: Teledyne Industries, Inc., Los Angeles, Calif.

[21] Appl. No.: 13,058

[22] Filed: Feb. 3, 1993

[51] Int. Cl.⁵ .......................... B05D 1/02; B05B 7/06
[52] U.S. Cl. ................................ 427/421; 427/424; 118/314; 118/315; 118/316; 118/676; 118/677
[58] Field of Search .......... 427/421, 96, 424; 118/314, 315, 316, 676, 677

[56] References Cited

U.S. PATENT DOCUMENTS

| | | | |
|---|---|---|---|
| 3,885,066 | 5/1975 | Schwenninger | 118/315 |
| 4,277,518 | 7/1981 | Schillke et al. | 427/96 |
| 4,451,000 | 5/1984 | Stephens | 228/20 |
| 4,535,722 | 8/1985 | Kondo | 118/315 |
| 4,607,590 | 8/1986 | Pender | 118/314 |
| 4,706,602 | 11/1987 | Polacek | 118/63 |
| 4,888,200 | 12/1989 | Milliken | 427/31 |

Primary Examiner—Shrive Beck
Assistant Examiner—David M. Maiorana
Attorney, Agent, or Firm—Hayes, Soloway, Hennessey, Grossman & Hage

[57] ABSTRACT

Improved non-electrostatic spray coating process and apparatus are provided. The process and apparatus of the present invention permit significant reduction in over-spray conditions as well as, the disadvantages and drawbacks associated therewith, without causing corresponding reduction in coating efficiency.

12 Claims, 2 Drawing Sheets

PROCESS AND APPARATUS FOR EFFICIENT SPRAY COATING

FIELD OF THE INVENTION

The present invention relates to an improvement in spray-coating of work pieces. The invention has particular utility in connection with spray-coating of printed circuit boards with photo-imageable resist material and will be described in connection with such utilities, other utilities are contemplated by the present invention.

DESCRIPTION OF THE PRIOR ART

In fabricating printed circuit boards, a uniform coating of liquid photo-imageable materials (and other materials) are routinely applied to the circuit board by, for example, roller coating, curtain coating, screen printing, electrostatic application, and so forth. In currently available workpiece spraying systems, over-spray is a problem, particularly in the case of automatic spray systems employing moving belts and the like. Over-spray typically collects on the moving belt, e.g., between the boards, along the belt sides, and even off the belt, in areas parallel to the belt. Over-spray is difficult to deal with and arrest. Over-spray drips from the coating chamber walls and from the belt, adding to materials cost and clean-up costs. Some of it may adhere to the belt, where it tends to accumulate in uneven layers. Over-spray conditions, if left uncorrected, may lead to degradation of machine performance. Additionally, conventional methods of over-spray clean up typically generate hazardous waste, which presents another problem.

The prior art has proposed several methods for solving the problems associated with over-spray, the most successful of which will be presently detailed. One prior art method for coping with over-spray involves placing a sheet of paper or other similar pieces of laminar material under the work pieces during spraying. The paper catches the over-spray, and the spattered paper is retrieved and discarded. While the use of paper or the like reduces the problem of machine contamination by over-spray, the spray-contaminated paper presents its own hazardous waste disposal problem. Also, the use of paper or the like does not prevent over-spray, but merely minimizes certain problems resulting therefrom.

Another prior art solution is presented in U.S. Pat. No. 4,888,200, issued to Milliken. Milliken discloses a process and apparatus for electrostatic spray-coating in which means for collecting over-spray and/or draining over-spray into the conductive belt is placed parallel to the spray zone. The collecting and draining means incline toward the belt, and a squeegee blade is positioned against the belt as the belt moves along its return-path (underneath the spray zone) to assist collection of over-spray which has collected on the belt. Just as before, although Milliken's disclosed process and apparatus attempt to mitigate the deleterious effects of over-spray in the spray-coating environment, they are not able to eliminate the source of the problem, namely, the over-spray condition itself. Additionally, electrostatic spray-coating presents a constant sparking hazard which, left unchecked, can result in ignition of the volatile chemicals commonly used in spraying.

OBJECTS OF THE INVENTION

It is therefore an object of the present invention to provide a spray-coating apparatus and process which eliminate the disadvantages and drawbacks of the prior art, without reduction in spraying efficiency or cost-effectiveness.

SUMMARY OF THE INVENTION

Accordingly, the present invention provides apparatus and process for non-electrostatic spray-coating of a work piece. The process of the instant invention comprises conveying a work piece past a plurality of linearly configured spraying means. The surface of the workpiece to be coated is oriented during conveyance normal to the travel direction. A liquid material is sprayed by the spraying means onto the workpiece. The spraying means are oriented so as to spray normal to the travel direction of the workpiece and to the surface thereof to be coated, and are also displaced from the workpiece by a predetermined distance. The linearly configured spraying means are adapted to produce substantially identical elliptically-shaped spray patterns on the workpiece, each of which patterns has a major axis height and overlap each other with a predetermined overlap factor, which preferably ranges between about 30% and 50% of the major axis height of the spray patterns. The spraying means are activated and deactivated in response to the presence of the workpiece.

BRIEF DESCRIPTION OF THE DRAWINGS

For a fuller understanding of the objects of the present invention, reference should be had to the following Detailed Description taken in conjunction with the accompanying drawings, in which.

DETAILED DESCRIPTION OF DETAILED EMBODIMENTS

Figure 1:
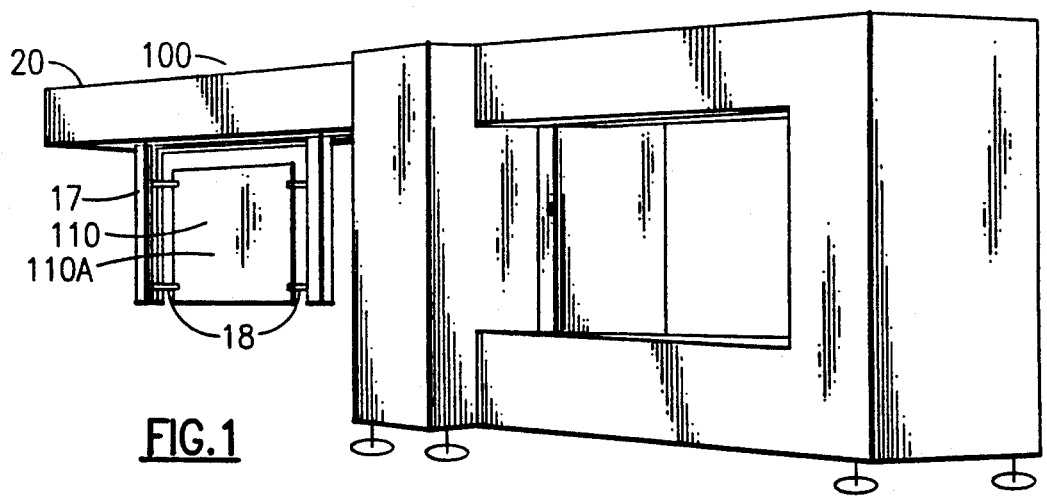
FIG. 1 is a simplified side-elevational view, illustrating an outside view of one preferred embodiment of a spray coating apparatus made according to the present invention.

FIG. 1 is a simplified side-elevational view of one preferred embodiment of a spray-coating apparatus according to the present invention. Depicted in FIG. 1 is apparatus 100 (preferably made of conventional metal and/or plastic materials) from which is hung workpiece 110 (which may be a flat-panel printed circuit board or similar type of article) having two surfaces at least one 110A of which is to be coated. Preferably, gripper means 18 comprises robotic, mechanical two-gripper arms of conventional construction, as shown in FIG. 1, for each of the panel 110. Any number of such gripper arms may be used, however, without departing from the present invention. Gripper means 18 are in turn connected to carry arms 17 for permitting the sprayer transport shuttle 20 to convey the workpiece 110 through the apparatus 100.

Figure 2:
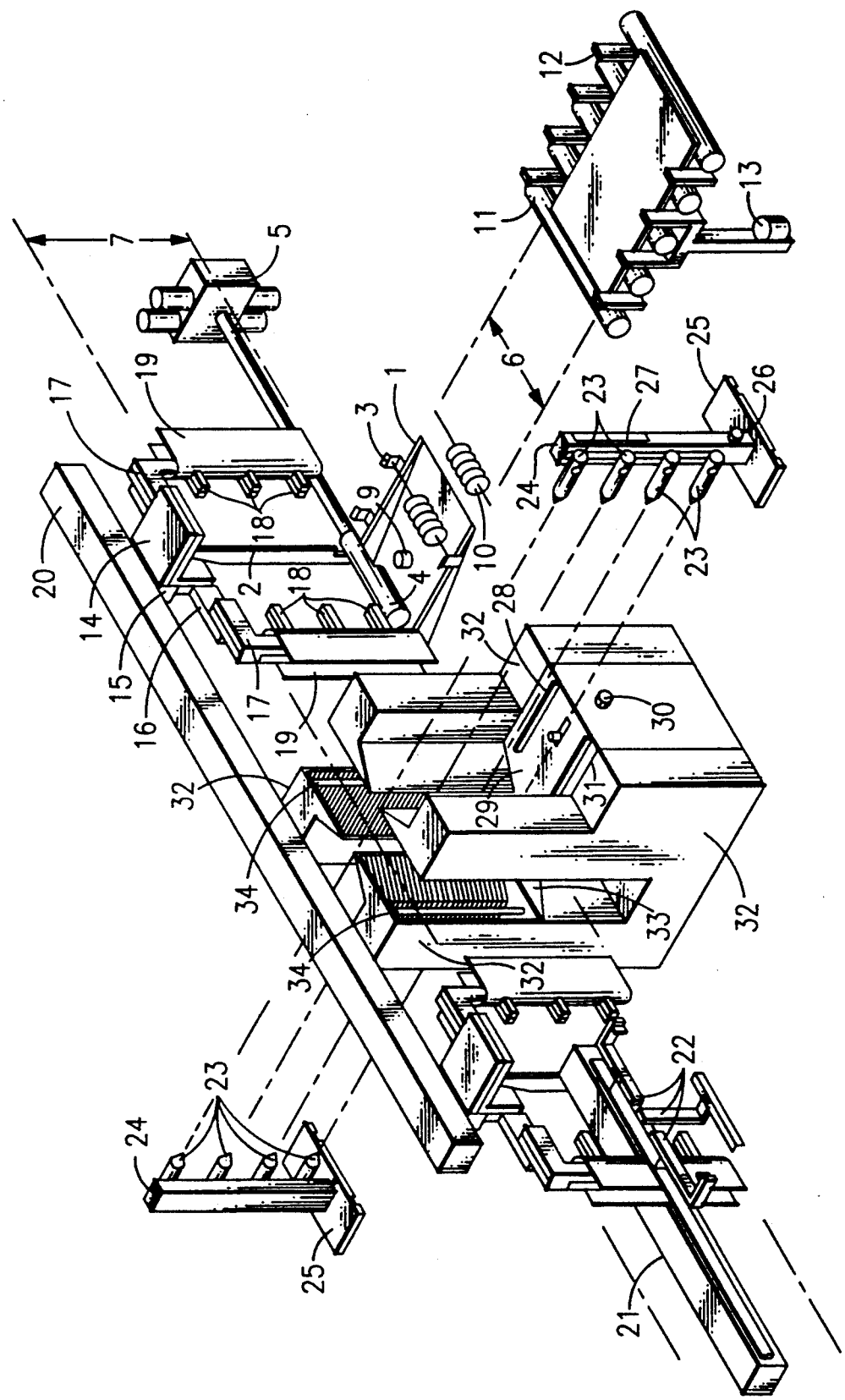
FIG. 2 is an exploded cut-away diagramatic representation of a variation of the preferred embodiment depicted in FIG. 1.

Turning to FIG. 2, a more detailed, cut-away, exploded view of a variation of the preferred embodiment, shown in FIG. 1, is depicted. Using the more detailed depiction in FIG. 2, the aspects of the apparatus 100 and process according to the instant invention will be presently described. At the outset of the spray-coating process according to the instant invention, workpiece 110 is preferably placed on centering roller conveyors 11 between centering fingers 12. Optical edge sensors (or other suitable sensing means) are used to verify that workpiece 110 is positioned exactly between (that is, equi-distant from) fingers 12 so that it may be conveyed by positioning conveyor 10 in entry plane 6 so as to enter the apparatus' swing arms 1. Once the presence of workpiece 110 between swing arms 1 is verified by panel presence sensor 9 (or other suitable sensing means) swing arms 1 are swung up about shaft 5A by conventional rotary actuating means 5 so as to be positioned adjacent stationary arms 2, serving inter alia as a backstop for swing arms 1. Optionally, swing arms 1 may include edge guides 3, 4 for permitting greater centering accuracy of the workpiece 110 between the swing arms 1 during loading thereof into the apparatus 100. Of course, the panel 110 may also be placed within the apparatus 100 by other means, e.g., conventional manual placement, and the like, without departing from the present invention.

After swing arms 1 have been actuated to place workpiece 110 in transport plane 7 (which preferably, in this embodiment, is oriented normal to entry plane 6 and is in a substantially vertical orientation), carry arms 17 and grippers 18 (which, at rest, are positioned in transport plane 7) are used to transport workpiece 110 in a travel direction (indicated by arrow d) in travel plane 7 through apparatus 100. First, carry arms 17 are spread apart to accommodate both the width W and thickness t of the workpiece 110. Preferably, the grippers 18 and carry arms 17 are adjustably mounted on frame 15 and actuable to permit accommodation of various dimensions of the workpiece 110. Additionally, and also, preferably, the distance between the grippers 18 and the number therefore adjusted to permit the grippers 18 to best carry various workpiece heights H. As shown in FIG. 2, in this embodiment, three grippers 18 per panel edge are used to hold on to and carry workpiece 110, although, as stated previously, any number of such grippers 18 may be used without departing from the present invention. Preferably, shields 19 are placed over carry arms 17 to protect the carry arms 17 and grippers 18 from inadvertent contamination and/or damage during spraying of the workpiece 110 in apparatus 100. Preferably these shields 19 are easily removable from the grippers 18 and transport arms 17 and are made of lightweight metal and/or plastic material and are easily disposable. Once panel 110 is positioned between grippers 18 and transport arms 17, transport arms 17 are actuated by conventional motive means (not shown) to allow grippers 18 to move into position so as to hold workpiece 110 in travel plane 7. Preferably and advantageously, the number of grippers used, the gripping tension force, and the compression force between arms 17, may be adjusted to formation of a small curvature along a vertical axis of the workpiece 110 so that it is held tensioned between arms 17 by grippers 18 (which do not clamp onto but rather barely contact workpiece 110), so as to prevent surface damage which might be caused by application of too much clamping force by clamping means 18. This edge-tensioning approach is especially advantageous when used to hold thin, flexible panels, as will be appreciated by those skilled in the art.

Once the panel 110 is thus held tensioned between arms 17, conveyor means (not shown) of conventional construction (for example, an endless belt or other type of suitable conveyor means) is used to transport board 110 at a predetermined velocity V in the travel direction d in plane 7 through apparatus 100, and more specifically, nearby spray guns 23. Spray guns 23 are adjustably mounted in linear configuration, vertically on gun spacer frame 24 which, in turn, is mounted on gun carriage 25. Spray guns 23 are of conventional construction and are designed to deliver high efficiency low-pressure spray of a liquid material to at least one surface 110A of the board 110. Preferably, as is shown in FIG. 2, the spray guns 23 are positioned on both sides of board 110 so as to be able to deliver the spray of liquid material (preferably, comprising photo-imageable materials) to both sides of the board 110. Preferably, the spray guns are of the type sold by Graco, Inc. of Minneapolis, Minn., Model HELP1600 or Model 210-744 Series C, which are described, in Graco, Inc. publication nos. 308-044, revision D and 307-237, revision J, respectively. However, other types of spray guns may be used. Preferably, atomizing and shaping air are introduced to the nozzles 23 at pressures under 10 psi. Liquid is pumped or pressure fed (according to conventional means) into the nozzles also at low pressures (that is, pressures adapted to permit efficient spray-coating of the workpiece without necessitating use of electrostatic coating techniques).

As is known to those skilled in the art, efficiency of high-volume, low-pressure spraying techniques is derived from the use of high mass air flow delivered at low nozzle pressures. Spray energy is required to shear spray liquids into many fine droplets to form the spray mist. Thus, in a preferred embodiment of the invention the spraying means 23 develop spray energy by using large amounts of air traveling at relatively low velocities to generate lower spray droplet velocities and lower spray-workpiece surface impact and reaction forces than used in electrostatic spray coating. Advantageously, use of such high-volume, low-pressure spraying-techniques results in less over-spray (due to reduction in the amount of spray reflected from workpiece surfaces) than other types of spraying techniques (most notably, electrostatic spraying). A further advantage gained by using high-volume, low-pressure spraying techniques is derived from the fact that such techniques produce the best results when spray nozzles are positioned close to the surface 110A to be coated. This reduces required droplet flight time and serves to reduce spray solvent evaporation and powder formation times thereby permitting use of faster drying spray materials.

Continuing the previous discussion, spray guns 23 are mounted on gun spacers 24 on carriages 25. Gun spacers 24 may comprise conventional means (well known to those skilled in the art) for changeably fixing the guns 23 to the carriages 25 in a desired orientation and spacial relationships with each other. Preferably, carriages 25 are slideably mounted on, and ride on guide rails 28 on platform 29 to permit spacing distance D adjustments (that is, adjustment of the distance D between nozzles 23 and the surface 110A) either manually or by use of automatic actuators 26. Additionally, the actuator means 26 (conventional motive means, or the like) may be preset so that upon selection of a desired, predetermined spacing distance, that distance may be automatically realized by actuating means 26. Also preferably, indicating means 27 (comprising conventional graphical and/or digital display and distance sensing means) is used to indicate current spacing between nozzles 23. Preferably, spacing among the nozzles of spraying means 23 themselves is identical and is chosen so as to satisfy a first relationship $S=H/N$, wherein H is the height of the workpiece and N is the number of nozzles on each side of the workpiece.

Figure 3:
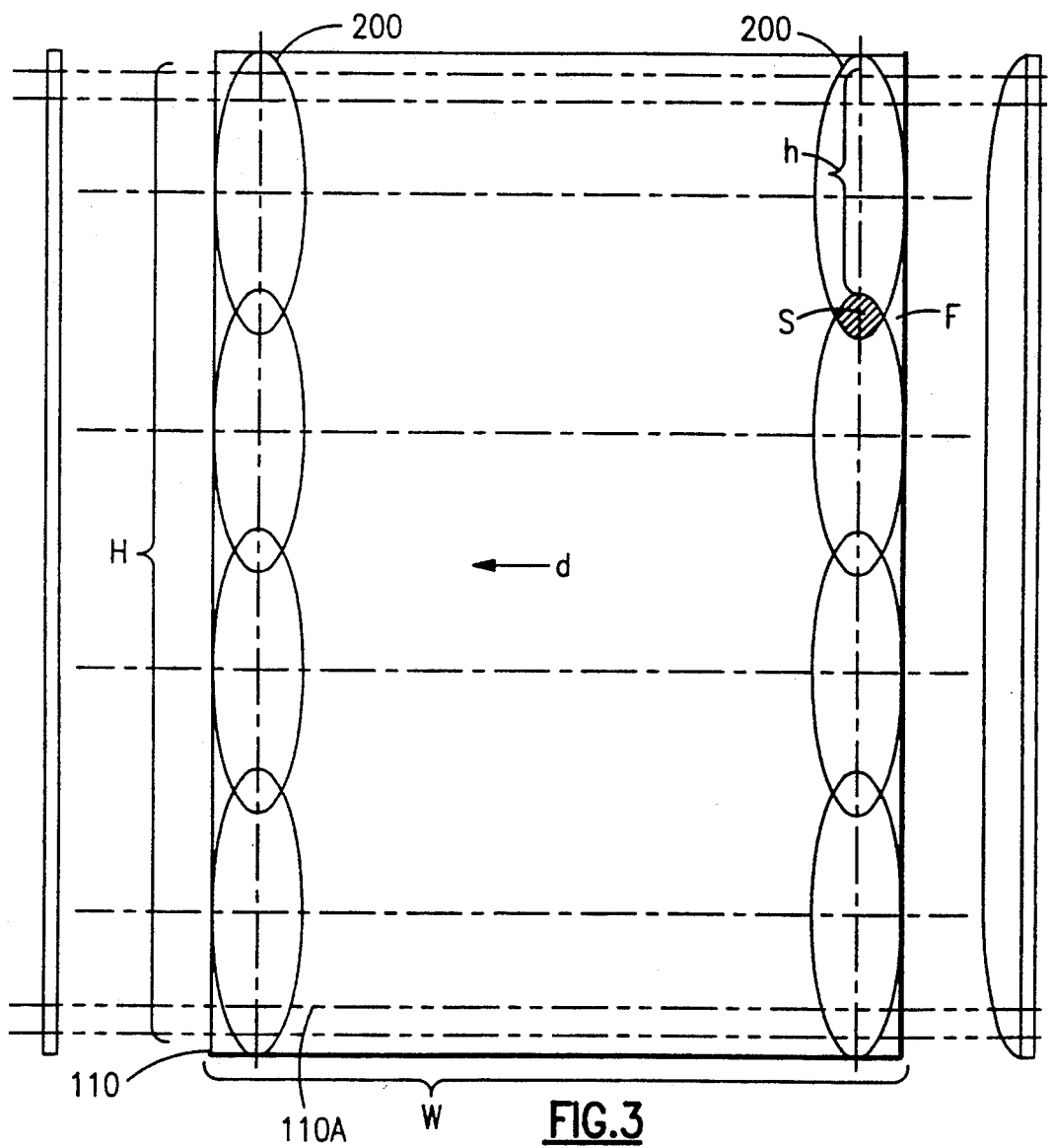
FIG. 3 is a simplified diagramatic illustration of a spray pattern produced by spraying means of the apparatus depicted in Figure; and While the present invention will be described in connection with preferred embodiments thereof, it will be understood by those skilled in the art that it is not intended to limit the invention to these embodiments. On the contrary, it is intended to cover all alternatives, modifications, and equivalents as may be included within the spirit and broad scope of the present invention as defined only by the claims.

According to the present invention, spray distance D between the spray means 23 and the workpiece 110 and the nozzles themselves are adapted to produce substantially identical, elliptically-shaped spray patterns 200 (as illustrated in FIG. 3) on workpiece 110. These elliptically-shaped spray patterns 200 have a major axis height h and overlap each other with an overlap factor F chosen so as to be within a range of between 30% and 50% of the spray pattern's major axis height. Advantageously, it has been found that by overlapping the ellipitical spray patterns 200 formed by the spraying means 23 within the aforesaid range, over-spray conditions may be minimized. Also, preferably, so as to further minimize over-spray, the flow rate Q at which the spray means 23 sprays the surface 110A of the workpiece 110 is made to satisfy a further relationship, $Q=N(1-F)HVT$, wherein T is the thickness to which the workpiece is desired to be coated with the liquid material.

Returning to FIG. 2, the spraying means 23 are preferably oriented so as to spray normal to the travel direction d and to surface 110A of the workpiece 110 to be coated. However, the spraying means may alternatively be oriented to spray the workpiece at an angle A relative thereto. In such a case, and preferably, the flow rate Q of the spray means 23 may be made to satisfy the relationship, $Q=2NVTD(1-F)\tan(A)$.

In any event, according to the present invention, spraying of the side (or sides) of the workpiece begins and ends immediately upon the workpiece beginning to be conveyed in between the spraying means 23, and after having been conveyed therepast, respectively. Determination of the position of the workpiece relative to the spraying means 23 is accomplished, preferably, by means of a conventional optical sensor (not shown) however, other sensing means may be used without departing from the present invention.

Once the panel 110 is conveyed within the spray station 34A of the exhaust housing 32, over-spray may be further reduced by the use of edge mask 33. Edge mask 33 comprises an angled metallic or plastic shield for excluding liquid coating from a desired small lower edge area of the surface 110A panel 110 to be coated. The coating free area produced by the shield 33 extends from the bottom edge of the panel 110 and, of course, may be adjusted depending upon the size and general masking characteristics of the lower edge mask 33. Liquid spray striking the mask 33 collects thereon and flows into a collection area therebeneath (not shown). Also contained within the exhaust housing 32 are exhaust boosters 34. These exhaust boosters 34 are of conventional construction and preferably comprise air knives appropriately shaped to utilize the Coanda principle (described, in detail in U.S. Pat. No. 4,451,000 issued to Stephens) to recirculate air within the exhaust housing 32 to reduce the volume of exhaust air required to remove vapors while spraying. Preferably, for example, a small amount of compressed air at very high pressure may be discharged from each airknife orifice. Each knife orifice preferably extends the full length of the knife and is of very small area. According to the coanda effect, air discharged from knives is diverted 90° (as a result of the knives' shape) and draws a disproportionately large amount of ambient air along with it. In conjunction with the activation and deactivation of the nozzles 23, the air knives are activated slightly before and after, activation and deactivation respectively, of the spraying means 23 so as to boost instantaneous air exhaust during spraying. Preferably for example, when the board 110 is being conveyed at a velocity of 2 feet per second, the "on" time of the air knives is approximately 12 seconds per minute.

Panels thus sprayed with the liquid material then exit the exhaust housing 32 whence they may be transported by, for example, an overhead conveyor (not shown) to a separate location (also not shown) further processing thereat.

It is evident therefore that there has been provided, in accordance with the present invention, an improved non-electrostatic spray-coating method and apparatus. While the invention has been described in connection with specific embodiments and methods of use thereof, various alternatives, modifications, and variations may be made without departing from the spirit and broad scope of the present invention. For example, although four high-volume low-pressure spraying means are preferably used to spray the panel, any number of such spraying means may be used so long as the various relationships described above in connection with embodiments of the process of the present invention are satisfied. Also, so as to further increase the advantageous effects of the spraying process according to the present invention, spacing distance S among spraying means 23 may be made substantially equal to $(1-F)/h$. Further, preferably, the distance D between the spraying means and the panel maybe made equal to half the major axis height h of the elliptical spray patterns 200. Other modifications are also possible without departing from the present invention. For example, the invention is not limited to the use of high-volume low-pressure spray means. Accordingly, the present invention is intended to embrace all such alternatives, modifications, and variations as may fall within the spirit and broad scope of the hereinafter appended claims.

I claim:

1. A process for spray coating the surface of a workpiece having at least one surface, said process comprising:
   a. conveying said workpiece in a travel path past a plurality of linearly configured spraying means; and
   b. directing a spray of liquid material from said plurality of linearly configured spraying means onto said surface, said spraying means being displaced from said surface by a distance D and being adapted to produce substantially identical elliptically-shaped spray patterns, each said elliptically-shaped pattern having a major axis height h, said patterns overlapping each other with an overlap factor F within a range of between 30 and 50 percent of said major axis height, and wherein said spray means is spaced from one another a spacing distance S which substantially satisfies a first relationship, $S=(1-F)/h$.

2. A process according to claim 1, wherein said spacing distance also substantially satisfies a second relationship, $S=H/N$ wherein H is the height of the workpiece, and N is the number of said spraying means.

3. A process according to claim 1, wherein said spray means have a flow rate Q, and including the step of coating said surface to a thickness of T, whereby $Q=N (1-F) h\, V\, T$, wherein V is the speed of the workpiece down the travel path.

4. A process according to claim 3, wherein N equals four and V equals two feet per second.

5. A process according to claim 1, wherein h equals 2 D.

6. A process according to claim 1, wherein:
i. said workpiece has two surfaces; and
ii. said plurality of spray means comprises two groups of linearly configured spray means, said groups facing opposite each other so as to be able to spray said two surfaces.

7. A process according to claim 1, wherein said spraying means is oriented substantially normal to said travel path.

8. A process for spray coating opposite surfaces of a workpiece, said process comprising:
a. conveying said workpiece in a travel path between two groups of linearly-configured, oppositely facing groups of spraying means; and
b. directing sprays of liquid material from said two groups of spraying means onto said two surfaces, said groups of spraying means being displaced from said two surfaces by a distance D, and being adapted to produce substantially identical elliptically-shaped spray patterns, each said elliptically-shaped pattern having a major axis height h, said patterns overlapping each other with an overlap factor F within a range of between 30 and 50 percent of said major axis height, and said spray means in each said group are spaced from each other by a spacing distance S substantially equal to $(1-F)/H$.

9. A process according to claim 8, wherein said spray means has a flow rate Q, and including the step of coating said surfaces to a thickness T, whereby $Q=2\, N\, V\, T\, D\, (1-F)\, \tan(A)$, wherein V is the speed of the workpiece down the travel path.

10. A process according to claim 8, wherein said spacing distance S is also substantially equal to H/N, wherein H is the height of the workpiece and N is the number of spray means.

11. A process according to claim 10, wherein N equals four and V equals two feet per second.

12. A process according to claim 10, wherein h equals 2 D.

* * * * *